May 31, 1966 L. F. WALLACE 3,254,280

SILICON CARBIDE UNIPOLAR TRANSISTOR

Filed May 29, 1963

WITNESSES

Theodore F. Wrobel

Raymond F. Mayiko

INVENTOR

Lloyd F. Wallace

BY

C. L. Menzemer

ATTORNEY

1

3,254,280

SILICON CARBIDE UNIPOLAR TRANSISTOR

Lloyd F. Wallace, Coatesville, Pa., assignor to Westinghouse Electric Corporation, Pittsburgh, Pa., a corporation of Pennsylvania Filed May 29, 1963, Ser. No. 284,119
3 Claims. (Cl. 317—237)

The present invention relates to a process for producing a silicon carbide unipolar transistor.

A unipolar transistor is a device in which a working current of majority carriers enters semiconductive material from a first electrode called the source and leaves the semiconductor material through a second electrode called the drain. A rectifying contact, called the gate, on the semiconductive region through which the current passes controls the magnitude of the current between the source and drain by reason of the creation of a depletion layer at the rectifying junction upon application of a reverse bias thereto. The current carrying region is called the channel and it will be of largest size when no reverse bias is placed across the gate junction and will essentially diminish to zero where a sufficient reverse voltage, called the pinch-off voltage, is applied.

Unipolar transistors have wide utility, but are particularly useful where a voltage signal is available which may provide essentially no current. The voltage signal is applied to the gate while a uniform current source applied to the source electrode provides the working current which will be modulated as a result of voltage fluctuations on the gate to produce a substantial current at the drain and thus amplify the signal applied to the gate. The voltage signal should, of course, be of the polarity to reversely bias the gate and may vary between zero and the pinch-off voltage. The gain or transconductance of a unipolar transistor which serves as a figure of how efficient amplification occurs, is therefore defined as the change in drain current produced by a unit change in gate voltage. It is, of course, desirable to maximize the transconductance while permitting relatively large drain currents.

Almost all of the unipolar transistor devices to date have been fabricated of germanium or silicon and are operable to a maximum junction temperature of about 100° C. for germanium and 200° C. for silicon. If higher temperatures are to be achieved, materials with a wider band gap must be employed. One such material capable of achieving very high operation temperatures, approximately 700° C., is silicon carbide with a band gap of 2.7 electron volts. The necessary requirements for a silicon carbide unipolar transistor with a double gate configuration are very thin channel thicknesses, low reverse leakage junctions, short channel lengths and non-penetrating contacts.

It is quite difficult to control junction positions with a silicon carbide material within close tolerances to achieve a very thin channel. The channel thickness, for pinch-off to occur between 50 and 100 volts is from 5 to 10 microns according to unipolar transistor theory. The gate junctions must also have low reverse leakage current to obtain maximum transconductance. The thin channel desired combined with the low mobility of current carriers usually results in a channel with high resistance. Therefore, a short channel length is required for satisfactory conductive characteristics.

Mechanical methods cannot be used to shape silicon carbide devices which with such close tolerances since surface damage caused by these methods may affect the electrical characteristics of the material, and fixtures to achieve close tolerances are difficult to construct.

2

Therefore, it is an object of the present invention to provide an improved process for producing a silicon carbide unipolar transistor.

Another object is to provide a process for producing a silicon carbide unipolar transistor exhibiting power gain.

Another object is to provide a process for producing unipolar transistor wherein the channel dimensions are readily controlled by electrolytic etching.

Other objects of the invention will, in part, be obvious and will, in part, appear hereinafter.

In order to more fully understand the nature and objects of the invention reference should be had to the following detailed description and drawings, in which.

In accordance with the present invention and in attainment of the foregoing objects, there is provided a method for producing a silicon carbide unipolar transistor. The transistor comprises a single crystal silicon carbide member having an inner region of a first conductivity, such as, n-type, completely enveloped by an outer region of a second conductivity, such as, p-type. However, the above regions could be reversed. The process comprises anodically etching away two or more small areas of the outer region to expose segments of the inner region. A source and a drain contact are then applied to the exposed segments and subsequently or in the same operation, gate contacts are applied to at least two portions of the outer region. Then electrical conductors are secured to the source drain and gate contacts to form a unipolar transistor.

In preparing the unipolar transistor of this invention, a single crystal of silicon carbide is grown in accordance with any suitable procedure known to those skilled in the art. The silicon carbide crystal may then be doped negatively with, for example, nitrogen, under a controlled atmosphere. The n-type member is then doped over its complete outer surface to a desired depth using a p-type dopant, such as, aluminum. This doping procedure may be carried out by alloying, vapor diffusion or a combination of alloying and solid state diffusion or any other method known in the art. Diffusion methods have been found particularly suitable since junction separation in silicon carbide is more adequately controllable.

Thereafter, selected areas of the p-type doped silicon carbide member are electrolytically etched away at a suitbale current so as to provide an adequate current density to expose segments of the n-type region. P-type silicon carbide etches readily when it is positive with respect to the solution whereas the n-type silicon carbide remains inert. Then a source and a drain contact comprising a material, such as, silicon may be applied to the exposed segments by a method, such as, alloying. Also, gate contacts comprising a material such as, silicon may be applied to unetched portions of the silicon carbide member, preferably between the source and drain contacts. Alternately, the gate junctions may be formed by epitaxial vapor growth of junctions on a silicon carbide seed or other suitable methods.

It should be understood that the use of silicon for forming ohmic contacts is merely exemplary. Any good ohmic contact material, such as, gold, tantalum, tungsten or base alloys thereof may be utilized therefor.

The various ohmic contacts may then be lapped to a desired film thickness using a diamond compound and rinsed with a suitable solvent. Subsequently electrical conductor leads may be attached to the ohmic contacts using a solder material, such as, a silver solder.

Merely as an example, the drawings will be described hereinafter with reference to a specific embodiment of the invention.

Figure 1:
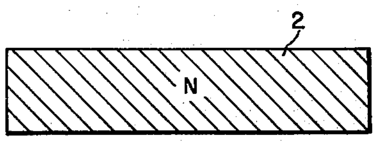
FIGURE 1 is a side view in cross section of a silicon carbide single crystal for use in the present invention.

Referring to FIGURE 1, there is shown a silicon carbide single crystal platelet 2 employed in the present invention. The platelet was grown from a silicon carbide seed and had a thickness of about 50 microns. The resistivity of this material after doping with an n-type nitrogen dopant varied from 10 to 100 ohm-centimeters at room temperature.

Figure 2:
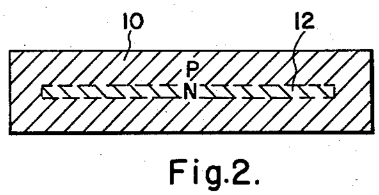
FIG. 2 is a side view in cross section of a silicon carbide member processed in accordance with the invention.

The silicon carbide platelet was then disposed in a suitable furnace to produce a p-type skin on the outer surfaces thereof using an aluminum dopant. The platelet was held at 1960° C. for 16 hours with an aluminum source temperature at 1400° C. under an inert atmosphere of 5% hydrogen-argon gas flowing at 300 cc./minute. The structure shown in FIG. 2 was thereby produced wherein the aluminum penetrated the crystal approximately to an equal depth of about 20 microns along the entire outer surface to form a p-type skin 10 over the remaining n-type region 12. It should be appreciated that the time and temperatures indicated above may be varied to obtain essentially the same result.

Figure 3:
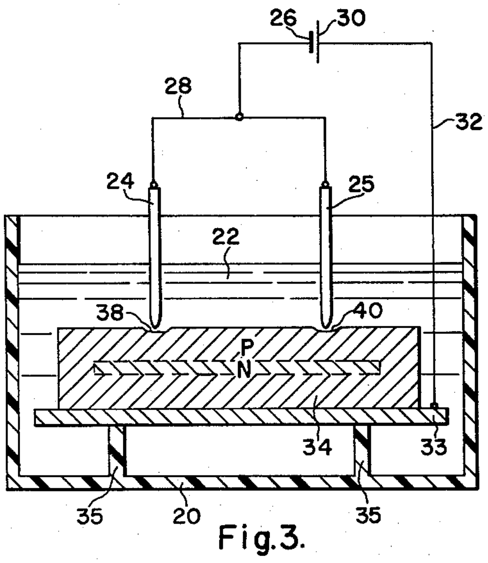
FIG. 3 is an apparatus for etching a silicon carbide surface in which the crystal acts as an anode.

Referring now to FIG. 3, the numeral 20 indicates a container made of material which will resist attack by the electrolyte. For example, when a hydrogen fluoride engendering compound is used to provide the electrolyte, the container may be made of a suitable plastic, such as, polyethylene or other material that resists attack by HF. In other instances when acid attack is not significant, glass ceramic or the like may be used as desired. An electrolyte 22, in this particular instance 1% hydrofluoric acid-methyl alcohol, was placed in a polyethylene container 20. An inert cathode 24 and 25 made of platinum (carbon being also satisfactory), was connected to one side of a battery 26 by a lead 28 and was immersed partially in the electrolyte. The other side of the battery 30 was connected by a lead 32 to an electrically conductive metal member 33, comprising, platinum which was secured to the lower surface of the silicon carbide crystal 34 to be etched. The complete unit was supported in the container 20 by means of fixture 35. An electrical potential of 10 to 25 volts depending upon the solution and crystal resistivity was then applied to the circuit to produce a current density of approximately from 0.1 to 0.4 ampere/cm.$^2$ so that a small area of the p-type skin at 38 and 40 is completely etched away directly below the cathodes 24 and 25 to expose the n-type region 56, shown in FIG. 4. It should be understood that only one cathode may be employed and the areas etched individually.

Figure 4:
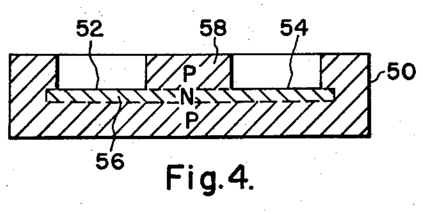
FIG. 4 is a side view in cross section of a silicon carbide member after etching in accordance with the invention.

Referring to FIG. 4 there is shown the silicon carbide crystal 50 after etching wherein areas 52 and 54 of the n-type region 56 are exposed, the exposed segments being separated by an unetched p-type region 58.

It is readily apparent that the etching procedure facilitates removal of the p-skin without producing physical damage, such as, strains and microfracture in the channel 54 which may be detrimental to a device characteristics. The shape and dimensions of the channel are controlled by either the shape of the cathode or the motion of the probe. The length of the channel is also readily controlled by the spacing of the two cathodes employed in the etching apparatus and the final spacing of the exposed segments which ultimately functions as the source and drain of the transistor device.

Figure 5:
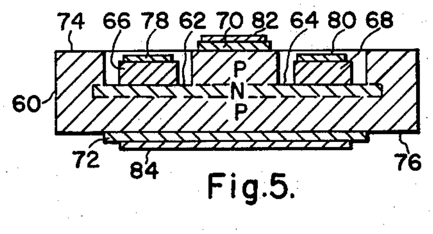
FIGS. 5 and 6 are side views in cross section of a silicon carbide unipolar transistor produced in accordance with the teachings of the invention.

Referring to FIG. 5, source and drain contacts were made to the silicon carbide member 60 by disposing on exposed surfaces 62 and 64 a silicon member 66 and 68 doped with phosphorous. Similarly, gate contacts were provided by disposing a boron doped silicon member 70 and 72 to unetched portions 74 and 76 of the silicon carbide member 60 between the ultimate source and drain contacts. The member with all applied contacts fixed in place were disposed in a furnace and held at a temperature of 1700° C. under an argon atmosphere until suitable alloying of the silicon members and the silicon carbide member 60 took place. The contacts were lapped with a diamond compound until only a thin film of silicon remained on the surface. The silicon surfaces were then cleaned with a hydrofluoric-nitric acid mixture. Next a silver foil material 78, 80, 82 and 84 was disposed on the silicon surface to facilitate the attachment of electrical conductors thereto. The member 60 was disposed in a carbon resistance heater at 925° C. in a vacuum of $10^{-4}$ millimeters of mercury. This temperature was held for approximately 3 minutes after which the unit was annealed at 400° C. for 10 minutes. The unit was then cleaned in molten $NA_2O_2$ at 525° C. Finally, the member 60 was rinsed in hydrochloric acid, distilled water and hydrofluoric acid.

Figure 6:
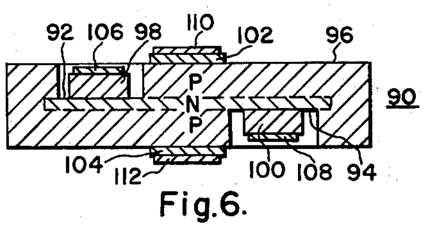

With reference to FIG. 6, there is shown a transistor device 90 have a geometry different than that shown in FIG. 5. The device 90 may be produced by employing one of the cathodes 24 or 25 shown in FIG. 3 so that the p-skin is etched away to expose one segment 92 on the upper surface and a segment 94 on the lower surface of the silicon carbide member 96. The source and drain contacts 98 and 100, the gate contacts 102 and 104 and the silver contacts 106, 108, 110 and 112 may all be applied in the same manner as set forth with respect to FIG. 5.

Typical devices made as described in the foregoing, such as, the device shown in FIG. 5, have been found to have the following characteristics. The pinch-off voltage was approximately 23 volts at room temperature and the saturated drain current was about 0.83 milliampere. The channel resistance at this temperature was approximately 10,000 ohms. The A.-C. power gain was 370 at room temperature and 8 at 500° C., while the static transconductance varied from 190 micromhos to 13 micromhos over the same temperature range.

While the present invention has been shown and described with respect to a specific embodiment only, it will be obvious to those skilled in the art that it is not so limited, but is susceptible of various changes and modifications without departing from the spirit and scope thereof.

I claim:

1. A unipolar transistor, said unipolar transistor being comprised of a body of single crystal silicon carbide, said body having a top surface and a bottom surface, said body having a first layer of first type conductivity and a second layer of second type conductivity, said second type conductivity being of opposite type conductivity from said first type conductivity, said first layer being entirely surrounded by said second layer, at least two distinct small spaced openings in said second layer, said small spaced openings extending down from the surface of said second layer to the same surface of said first layer, two electrodes, each of said two electrodes being disposed in each of said small spaced openings and affixed to the same surface of said first layer, an electrode disposed between said small spaced openings in said second layer and affixed to said top surface of said body and an electrode affixed to said bottom surface of said body.

2. A unipolar transistor, said unipolar transistor being comprised of a body of single crystal silicon carbide, said body having a first layer of first type conductivity and a second layer of second type conductivity, said second type conductivity being of opposite type conductivity from said first type conductivity, said first layer being entirely surrounded by said second layer, at least two distinct small spaced openings in said second layer, said openings extending from the surface of said second layer down to at least the surface of said first layer and to create at least two major external surface areas of said second layer, a first body of silicon having a first type conductivity disposed in one of said small spaced openings and affixed to said surface of said first layer, a second body of silicon having a first type conductivity disposed in another of said small spaced openings and affixed to said surface of said first layer, a third body of silicon having a second type conductivity disposed between said small spaced openings and affixed to one of said major external surface areas of said second layer, a fourth body of silicon having a second type conductivity disposed opposite to said third body and affixed to a second major external surface area of said second layer, said first body of silicon is a portion of a source contact, said second body of silicon is a portion of a drain contact and said third and said fourth bodies of silicon are each a portion of a gate contact, and an electrical contact affixed to each of said first, said second, said third and said fourth bodies of silicon.

3. A unipolar transistor, said unipolar transistor being comprised of a body of single crystal silicon carbide, said body having a top surface and a bottom surface, said body having a first layer of first type conductivity and a second layer of second type conductivity, said second type conductivity being of opposite conductivity from said first type conductivity, said first layer being entirely surrounded by said second layer, at least two distinct small spaced openings in said second layer, said openings extending from the surface of said second layer down to at least the same surface of said first layer, a first body of silicon having a first type conductivity disposed in one of said small spaced openings and affixed to said surface of said first layer, a second body of silicon having a first type conductivity disposed in another of said small spaced openings and affixed to the same surface of said first layer, a third body of silicon having a second type conductivity disposed between said small spaced openings in said second layer and affixed to said top surface of said body, a fourth body of silicon having a second type conductivity affixed to said bottom surface of said body, and said first body of silicon is a portion of a source contact, said second body of silicon is a portion of a drain contact and said third and said fourth bodies of silicon are each a portion of a gate contact, an electrical contact affixed to each of said first, said second, said third and said fourth bodies of silicon semiconductor material.

References Cited by the Examiner

UNITED STATES PATENTS

| | | | |
|---|---|---|---|
| 2,656,496 | 10/1953 | Sparks | 317—235 |
| 2,918,396 | 12/1959 | Hall | 317—237 X |
| 2,937,324 | 5/1960 | Kroko | 317—234 |
| 2,954,307 | 9/1960 | Shockley. | |
| 3,054,034 | 9/1962 | Nelson | 317—235 |
| 3,078,219 | 2/1963 | Chang | 317—234 X |
| 3,126,505 | 3/1964 | Shockley | 317—235 |
| 3,152,294 | 10/1964 | Siebertz et al. | 317—235 |
| 3,164,500 | 1/1965 | Benda | 317—235 |
| 3,176,153 | 3/1965 | Bejat et al. | 317—235 X |
| 3,183,128 | 5/1965 | Liestiko et al. | 317—235 |

FOREIGN PATENTS

| | | |
|---|---|---|
| 915,182 | 1/1963 | Great Britain. |
| 921,947 | 3/1963 | Great Britain. |

JOHN W. HUCKERT, *Primary Examiner.*

JAMES D. KALLAM, DAVID J. GALVIN, *Examiners.*

A. M. LESNIAK, *Assistant Examiner.*